(12) United States Patent
Kim (10) Patent No.: US 12,237,034 B2
(45) Date of Patent: Feb. 25, 2025

(54) MEMORY CONTROLLER AND MEMORY SYSTEM INCLUDING THE SAME

(71) Applicant: Samsung Electronics Co., Ltd., Suwon-si (KR)

(72) Inventor: Hoyoun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/380,185

(22) Filed: Oct. 15, 2023

(65) Prior Publication Data

US 2024/0145025 A1    May 2, 2024

(30) Foreign Application Priority Data

Nov. 2, 2022   (KR) .................. 10-2022-0144728

(51) Int. Cl.
*G11C 29/00* (2006.01)
*G11C 7/10* (2006.01)
*G11C 29/52* (2006.01)

(52) U.S. Cl.
CPC ............ *G11C 29/52* (2013.01); *G11C 7/1039* (2013.01); *G11C 7/1063* (2013.01)

(58) Field of Classification Search
None
See application file for complete search history.

(56) References Cited

U.S. PATENT DOCUMENTS

| | | | |
|---|---|---|---|
| 7,945,826 B2 | 5/2011 | Kameda et al. | |
| 8,751,904 B2 | 6/2014 | Wang et al. | |
| 9,571,175 B2 | 2/2017 | Yang et al. | |
| 9,575,835 B2 | 2/2017 | Vogelsang et al. | |
| 9,954,555 B2 | 4/2018 | Voutilainen | |
| 11,398,836 B2 * | 7/2022 | Saliba | H03M 13/3761 |
| 2004/0133836 A1 * | 7/2004 | Williams | H04L 1/0057 |
| | | | 714/746 |
| 2004/0237023 A1 * | 11/2004 | Takahashi | G06F 11/1008 |
| | | | 714/768 |
| 2005/0108613 A1 * | 5/2005 | Kobayashi | G11B 20/1833 |
| | | | 714/E11.034 |
| 2011/0035539 A1 * | 2/2011 | Honda | G06F 11/1068 |
| | | | 711/E12.001 |

(Continued)

FOREIGN PATENT DOCUMENTS

KR          101419335 B1      7/2014

*Primary Examiner* — Mujtaba M Chaudry
(74) *Attorney, Agent, or Firm* — Muir Patent Law, PLLC (57) ABSTRACT

A memory controller includes an error correction code (ECC) circuit configured to receive a data burst and generate first ECC data or second ECC data, and a processor configured to control operations of the ECC circuit. The ECC circuit includes an ECC select circuit configured to select and output one of first ECC conversion data and second ECC conversion data, based on an ECC select signal from outside the memory controller, and an ECC conversion circuit configured to generate the first ECC data by encoding the data burst, based on the first ECC conversion data, or generate the second ECC data by encoding the data burst, based on the second ECC conversion data. The second ECC conversion data is set to be capable of correcting an error generated in one or more preset protected bits among bits included in each of pieces of partial data included in the data burst.

20 Claims, 10 Drawing Sheets

(56) References Cited

U.S. PATENT DOCUMENTS

| | | | |
|---|---|---|---|
| 2011/0307758 A1* | 12/2011 | Fillingim | G06F 11/1048 |
| | | | 714/E11.03 |
| 2017/0255509 A1* | 9/2017 | Tsuboi | G06F 11/1044 |
| 2020/0034666 A1 | 1/2020 | Yun et al. | |
| 2021/0143839 A1 | 5/2021 | Saliba | |
| 2022/0012126 A1 | 1/2022 | Galbi et al. | |
| 2022/0116057 A1 | 4/2022 | Doubchak et al. | |
| 2024/0086282 A1* | 3/2024 | Kaynak | G06F 11/1048 |

* cited by examiner

MEMORY CONTROLLER AND MEMORY SYSTEM INCLUDING THE SAME

CROSS-REFERENCE TO RELATED APPLICATION(S)

This application is based on and claims priority under 35 U.S.C. § 119 to Korean Patent Application No. 10-2022-0144728, filed on Nov. 2, 2022, in the Korean Intellectual Property Office, the disclosure of which is incorporated by reference herein in its entirety.

BACKGROUND

The inventive concept relates to a memory controller, and relates to a memory controller that encodes a data burst based on an error correction code (ECC) select signal.

A memory device is a device that stores various types of data, and may include a nonvolatile memory device, such as a flash memory device and a volatile memory device, such as a dynamic random access memory (DRAM). Due to various factors affecting the reliability of a memory cell included in a memory device, an error may occur in data stored in the memory device. An error occurring in data stored in a memory device may reduce the reliability of the memory device. Therefore, it is necessary to develop a method of detecting and correcting errors occurring in data stored in a memory device.

SUMMARY

The inventive concept provides a memory controller that encodes and decodes data to correct errors in critical bits among bits included in data stored in a memory device.

According to an aspect of the inventive concept, there is provided a memory controller controlling a memory device. The memory controller may include an error correction code (ECC) circuit which receives a data burst and generates first ECC data or second ECC data, and a processor which controls operations of the ECC circuit. The ECC circuit includes an ECC select circuit configured to select and output one of first ECC conversion data and second ECC conversion data based on an ECC select signal received from an outside of the memory controller, and an ECC conversion circuit configured to generate the first ECC data by encoding the data burst based on the first ECC conversion data or generate the second ECC data by encoding the data burst based on the second ECC conversion data. The second ECC conversion data may be set to be capable of correcting an error generated in one or more preset protected bits among bits included in each of pieces of partial data included in the data burst.

According to another aspect of the inventive concept, there is provided a memory system including a memory device and a memory controller. The memory device may include a plurality of memory cell arrays and an error correction code (ECC) circuit. The memory controller may be configured to transmit a data burst and an ECC select signal to the memory device. The ECC circuit may be configured to select one of first ECC conversion data and second ECC conversion data based on the ECC select signal and generate first ECC data or second ECC data by encoding the data burst based on the selected one of the first ECC conversion data and the second ECC conversion data. The plurality of memory cell arrays may be configured to store the data burst and the first ECC data or the second ECC data generated by the ECC circuit.

According to another aspect of the inventive concept, there is provided a memory system including a memory device and a memory controller. The memory device may include a plurality of memory cell arrays and an error correction code (ECC) circuit. The memory controller may be configured to transmit a read command and an ECC select signal to the memory device. The plurality of memory cell arrays may be configured to store a data burst and ECC data associated with the data burst. The ECC circuit may be configured to select one of first ECC conversion data and second ECC conversion data based on the ECC select signal in response to the read command, and decode the data burst and the ECC data output from the plurality of memory cell arrays based on the selected one of the first ECC conversion data and the second ECC conversion data.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, example embodiments of the inventive concept will be described in detail with reference to the accompanying drawings.

Figure 1:
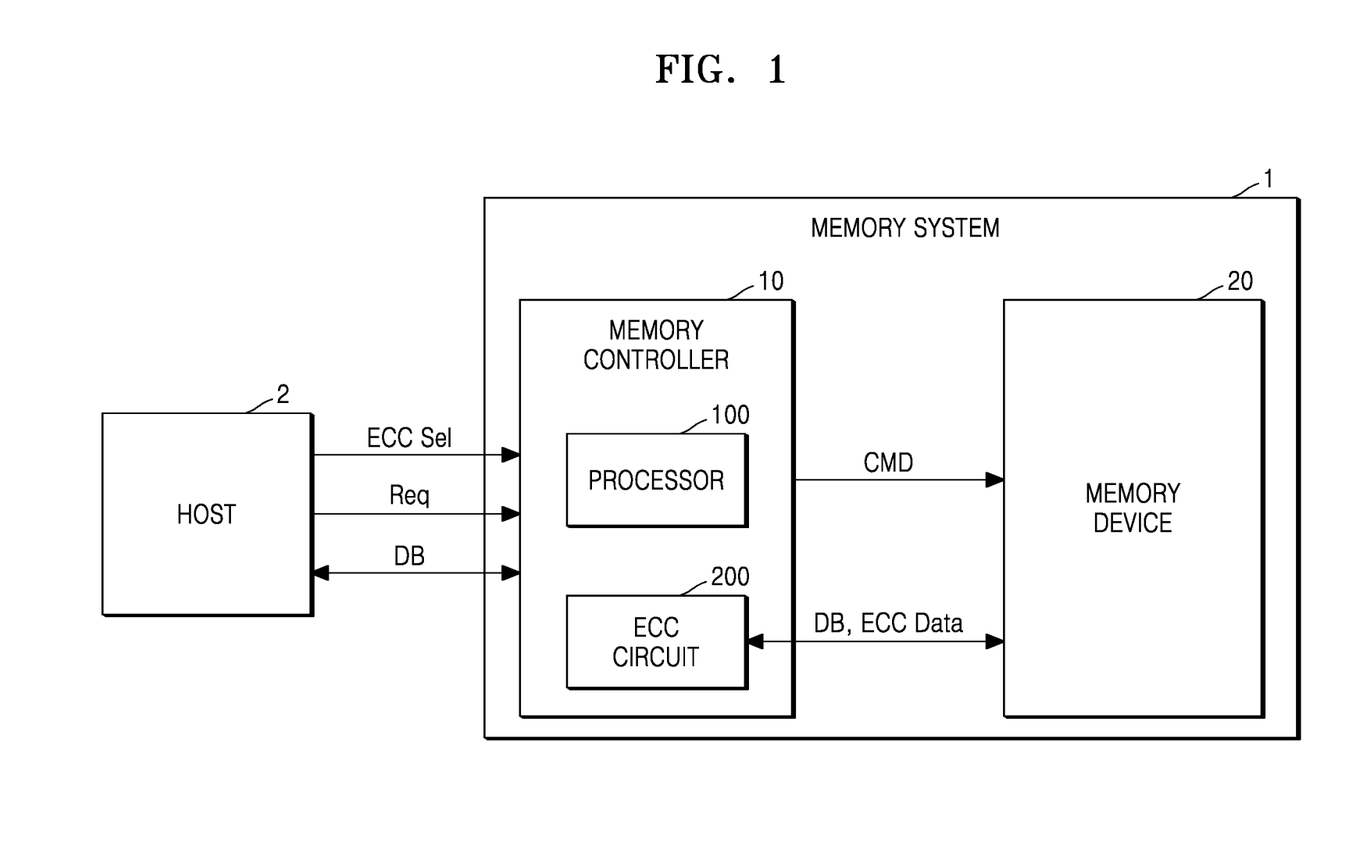
FIG. 1 is a block diagram illustrating a memory system including a memory controller according to an embodiment.

FIG. 1 is a block diagram illustrating a memory system including a memory controller according to an embodiment.

Referring to FIG. 1, a memory system 1 according to an embodiment may include a memory controller 10 and a memory device 20.

The memory system 1 may be implemented as an internal memory embedded in an electronic device, or may be implemented as an external memory detachable from an electronic device. For example, the memory system 1 may be implemented in various forms, such as an embedded Universal Flash Storage (UFS), an embedded multi-media security card (eMMC), a solid state drive (SSD), a UFS memory card, a compact flash (CF), a secure digital (SD), a micro secure digital (micro-SD), a mini secure digital (mini-SD), an extreme digital (xD), a memory stick, and the like.

The memory system 1 may perform a data read operation, a data write operation, and the like, based on a request received from an external host 2. In an embodiment, the memory system 1 may operate based on an Error Correction Code (ECC) select signal ECC Sel, a request Req, and a data burst DB received from the host 2.

The memory controller 10 may control the overall operation of the memory system 1. For example, the memory controller 10 may control data exchange between the host 2 and the memory device 20. The memory controller 10 may operate based on the ECC select signal ECC Sel, the request Req, and the data burst DB, which are received from the host 2.

In one embodiment, when the request Req received from the host 2 is a write request, the memory controller 10 may generate ECC data by encoding the data burst DB based on the ECC select signal ECC Sel, and write the data burst DB and ECC data to the memory device 20.

In addition, in one embodiment, when the request Req received from the host 2 is a read request, the memory controller 10 may decode the data burst DB and ECC data output from the memory device 20 based on the ECC select signal ECC Sel and transmit the decoded result to the host 2.

The memory controller 10 may include a processor 100 and an ECC circuit 200.

The processor 100 may control the overall operation of the memory controller 10. For example, the processor 100 may control an operation inside the memory controller 10 by executing an instruction stored in the memory controller 10, or may control various operations related to data erasure, a program, etc. In addition, the processor 100 may control the ECC circuit 200.

The ECC circuit 200 may generate first ECC data or second ECC data by receiving the data burst DB from the host 2.

In detail, the ECC circuit 200 may select one of first ECC conversion data and second ECC conversion data based on the ECC select signal ECC Sel. In addition, the ECC circuit 200 may generate the first ECC data by encoding the data burst DB based on the first ECC conversion data, or may generate the second ECC data by encoding the data burst DB based on the second ECC conversion data.

In addition, the ECC circuit 200 may decode the data burst DB and ECC data output from the memory device 20.

In detail, the ECC circuit 200 may select one of first ECC conversion data and second ECC conversion data based on the ECC select signal ECC Sel. In addition, the ECC circuit 200 may decode the data burst DB and ECC data output from the memory device 20 based on one selected from the first ECC conversion data and the second ECC conversion data.

A detailed configuration and operation of the ECC circuit 200 will be described later with reference to FIG. 3.

The memory device 20 may be controlled by the memory controller 10. The memory device 20 may write or read data based on a command received from the memory controller 10.

In an embodiment, the memory device 20 may be a Double Data Rate Synchronous Dynamic Random Access Memory (DDR SDRRAM) device. However, the embodiments are not limited thereto. The memory device 20 may be any one of volatile memory devices, such as a Low Power Double Data Rate (LPDDR) SDRAM, a Wide I/O DRAM, a High Bandwidth Memory (HBM), and a Hybrid Memory Cube (HMC). According to an embodiment, the memory device 20 may be any one of nonvolatile memory devices, such as a flash memory, a Phase Change RAM (PRAM), a Magnetic RAM (MRAM), a Resistive RAM (RRAM), and a Ferroelectric RAM (FRAM).

The host 2 may store data in the memory system 1 or read data stored in the memory system 1.

The host 2 may transmit an ECC select signal ECC Sel, a request Req, and a data burst DB to store data in the memory system 1. In addition, the host 2 may transmit an ECC select signal ECC Sel and a request Req to read data stored in the memory system 1, and may receive a data burst DB from the memory system 1. In this case, the host 2 may set and output the ECC select signal ECC Sel according to the request Req and the data burst DB.

In an embodiment, the host 2 may include a machine learning model. In this case, the host 2 may transmit the weight, the activation value, and the like used in the machine learning model to the memory system 1 as a data burst DB and store the same.

The host 2 may be any one of devices, such as a central processing unit (CPU) or a graphical processing unit (GPU) in an electronic device in which the memory system 1 is embedded.

Figure 2:
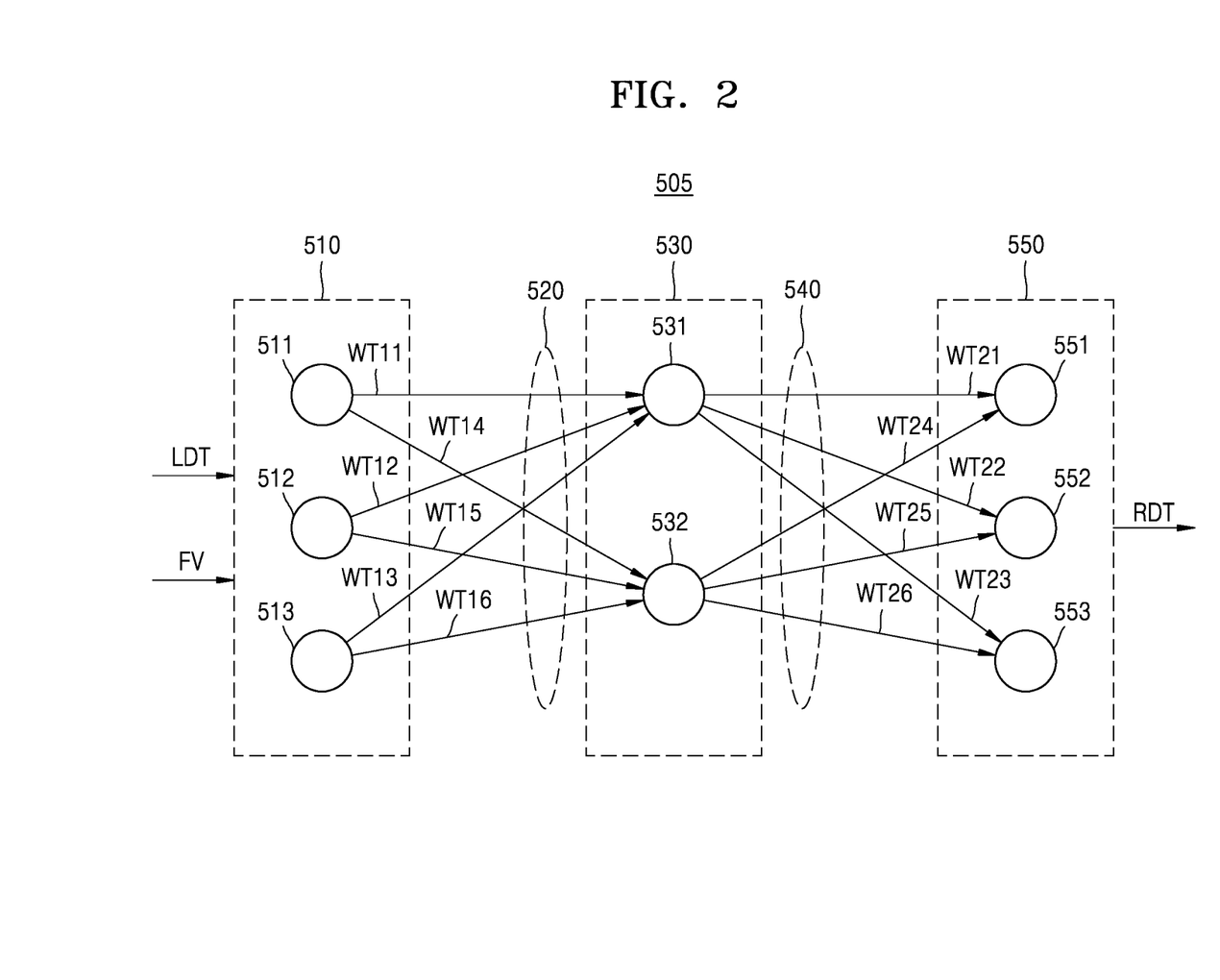
FIG. 2 is a diagram illustrating an example of a machine learning model that may be included in a host connected to a memory system according to an embodiment.

FIG. 2 is a diagram illustrating an example of a machine learning model that may be included in a host connected to a memory system according to an embodiment.

Referring to FIG. 2, the machine learning model 505 may include an input layer 510, a hidden layer 530, an output layer 550, first connection lines 520, and second connection lines 540.

The input layer 510 may include input nodes 511, 512, and 513. The hidden layer 530 may include hidden nodes 531 and 532. The output layer 550 may include output nodes 551, 552, and 553.

The input nodes 511, 512, and 513 of the input layer 510 may receive learning data LDT or a feature vector FV and transmit the learning data LDT or the feature vector FV to the hidden layer 530 through the first connection lines 520 having the first weights WT11 to WT16.

The hidden nodes 531 and 532 of the hidden layer 530 may perform operations on the learning data LDT or the feature vector FV received from the input layer 510 and transmit the operation to the output layer 550 through the second connection lines 540 having the second weights WT21 to WT26.

The output nodes 551, 552, and 553 of the output layer 550 may perform operations on values transmitted from the hidden layer 530 to output result data RDT corresponding to the learning data LDT or the feature vector FV.

In another embodiment, the machine learning model 505 may be included in the memory system 1.

Values, such as first weights WT11 to WT16, second weights WT21 to WT26, and result data RDT used in the machine learning model 505 may be written to the memory system 1, and may be read from the memory system 1 and used again for the operations of the machine learning model 505. In this case, values, such as the first weights WT11 to WT16 and the second weights WT21 to WT26 do not significantly affect the operational reliability of the machine learning model 505 if the critical bit value (e.g., the most significant bit (MSB) value) is accurate, even if all bits included in the data are not accurate. Accordingly, the memory system 1 according to the inventive concept may generate ECC data based on critical bit values, thereby improving recovery performance for critical bits and increasing the operating speed of the memory system 1.

Figure 3:
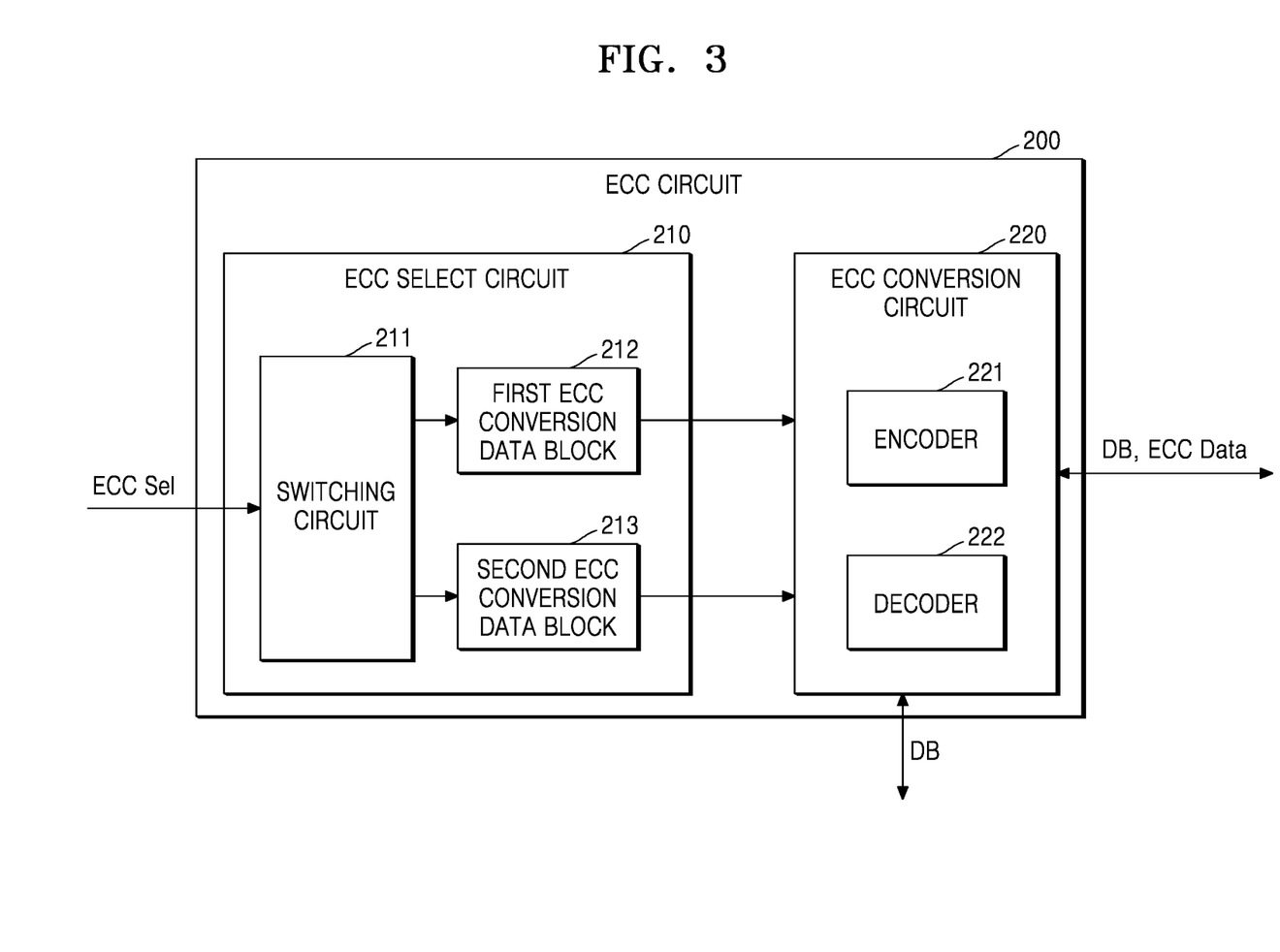
FIG. 3 is a block diagram illustrating, in more detail, an error correction code (ECC) circuit included in a memory controller according to an embodiment.

FIG. 3 is a block diagram illustrating, in more detail, an ECC circuit included in a memory controller according to an embodiment.

Referring to FIG. 3, the ECC circuit 200 included in the memory controller 10 according to an embodiment may include an ECC select circuit 210 and an ECC conversion circuit 220.

The ECC select circuit 210 may select and output one of the first ECC conversion data and the second ECC conversion data based on the ECC select signal ECC Sel received from the outside of the memory controller 10 (e.g., host 2).

The ECC select signal ECC Sel may be a signal for configuring how the ECC circuit 200 performs ECC conversion on the data burst DB. For example, the ECC select signal ECC Sel may be a command CMD transmitted from the host 2. The ECC select circuit 210 may select and output one of the first ECC conversion data and the second ECC conversion data based on the ECC select signal ECC Sel, so that the ECC conversion corresponding to the ECC select signal ECC Sel may be performed in the ECC conversion circuit 220.

The ECC conversion data may be data including information used in an operation for ECC conversion. In an embodiment, the ECC conversion data may include a parity check matrix (e.g., an H-matrix) used for ECC conversion.

The ECC conversion data may include first ECC conversion data and second ECC conversion data.

The first ECC conversion data may be set to correct an error occurring in any one of all bits included in the data burst DB. For example, the first ECC conversion data may correspond to ECC conversion data for correcting errors included in all bits of the data burst DB. For example, the first ECC conversion data may be data set to enable single error correction (SEC), single 2-symbol error correction (S2EC), or single error correction double error detection (SECDED).

In an embodiment, the first ECC conversion data may include a plurality of bits. For example, when the first ECC conversion data is "000" the ECC conversion circuit 220 may perform an ECC operation by using SEC, when the first ECC conversion data is "001" the ECC conversion circuit 220 may perform an ECC operation by using S2EC, and when the first ECC conversion data is "010" the ECC conversion circuit 220 may perform an ECC operation by using SECDED.

The second ECC conversion data may be set to be capable of correcting an error occurring in one or more preset protected bits among bits included in each of pieces of the partial data included in the data burst DB.

The partial data may be data corresponding to each of a plurality of values included in the data burst DB. For example, when the data burst DB has a total of 128 bits and includes four values of 32 bit length, the partial data may be 32 bit data corresponding to each value included in the data burst DB.

The protected bit may be at least one bit having the greatest influence on the reliability of data when an error occurs among bits included in the partial data. The protected bit may be preset by the user according to the type of data. In an embodiment, the protected bit may include the most significant bit of partial data.

The second ECC conversion data may be set to include one of a plurality of pieces of partial conversion information. In this case, each of the plurality of pieces of partial conversion information may be set to correct errors occurring in different numbers of protected bits. For example, any one of the plurality of pieces of partial conversion information may be information set to be capable of correcting errors occurring in one protected bit including the most significant bit of partial data. In addition, another of the plurality of pieces of partial conversion information may be information set to be capable of correcting errors occurring in two protected bits including the most significant bit and the second-most significant bit of the partial data. For example, the accuracy of the data burst DB and the conversion time of the data burst DB may vary when using the second ECC conversion data, depending on which partial conversion information of the plurality of partial conversion information the second ECC conversion data includes.

Since the second ECC conversion data is set to be capable of correcting errors generated among fewer bits compared to the first ECC conversion data, the second ECC conversion data may occupy a less capacity than the first ECC conversion data. For example, the parity check matrix included in the second ECC conversion data may have a smaller size than the parity check matrix included in the first ECC conversion data. Therefore, when the data burst DB is converted using the second ECC conversion data, the reliability of the data burst DB to the protected bit may be improved, and the operations required for conversion may be reduced.

In an embodiment, when the ECC select signal ECC Sel is a signal indicating that the data burst DB is data not used for machine learning, the ECC select circuit 210 may select and output the first ECC conversion data. In the case of general data other than data used for machine learning, all bits included in the data may have a similar level of importance. Therefore, the ECC select circuit 210 may select and output the first ECC conversion data for error detection and correction of all bits included in the data burst DB, when the ECC Sel is a signal indicating that the data burst DB is not used for machine learning.

Conversely, if the ECC select signal ECC Sel is a signal indicating that the data burst DB is data used for machine learning, the ECC select circuit 210 may select and output the second ECC conversion data.

In the case of data used for machine learning, if no error occurs in the protected bit, the operation reliability of machine learning model 505 is not greatly reduced. Therefore, the ECC select circuit 210 may select and output the second ECC conversion data to reliably correct the error of the protected bit when the ECC select signal ECC Sel is data in which the data burst DB is used for machine learning.

In an embodiment, the second ECC conversion data may be set by the ECC select circuit 210 to include one of the plurality of pieces of partial conversion information based on the type and characteristics of machine learning.

For example, when the type and characteristics of machine learning require a relatively high level of accuracy, such as human face recognition, the second ECC conversion data may be set to include partial conversion information with a large number of protected bits among the plurality of pieces of partial conversion information. In addition, when the type and characteristics of machine learning require a relatively low level of accuracy, such as animal classification, the second ECC conversion data may be set to include partial conversion information with a small number of protected bits among the plurality of pieces of partial conversion information.

In another embodiment, the second ECC conversion data may be set by the ECC select circuit 210 to include one of a plurality of pieces of partial conversion information based on the accuracy required for the data burst DB and the limit of the conversion time of the data burst DB.

In an embodiment, the second ECC conversion data may include a plurality of bits. For example, when the second ECC conversion data is "100" the ECC conversion circuit 220 may perform an ECC operation for the protected bit of one bit included in each of pieces of partial data included in the data burst DB, when the second ECC conversion data is "101" the ECC conversion circuit 220 may perform an ECC operation for the protected bit of two bits included in each of pieces of partial data included in the data burst DB, and when the second ECC conversion data is "110" the ECC conversion circuit 220 may perform an ECC operation for the protected bit of three bits included in each of pieces of partial data included in the data burst DB.

In detail, the second ECC conversion data may be set to include one of a plurality of pieces of partial conversion information such that the number of protected bits is proportional to the accuracy required for the data burst DB. For example, when the accuracy required for the data burst DB is relatively low, the second ECC conversion data may be set to include partial conversion information with a small number of protected bits among a plurality of pieces of partial conversion information. In addition, when the accuracy required for the data burst DB is relatively high, the second ECC conversion data may be set to include partial conversion information with a large number of protected bits among a plurality of pieces of partial conversion information.

The second ECC conversion data may be set by the ECC select circuit 210 to include one of a plurality of pieces of partial conversion information such that the number of protected bits is proportional to the limit of the conversion time of the data burst DB. For example, when the conversion time limit of the data burst DB is relatively short, the second ECC conversion data may be set to include partial conversion information with a small number of protected bits among a plurality of pieces of partial conversion information. In addition, when the conversion time limit of the data burst DB is relatively long, the second ECC conversion data may be set to include partial conversion information with a large number of protected bits among a plurality of pieces of partial conversion information.

The ECC select circuit 210 may include a switching circuit 211, a first ECC conversion data block 212, and a second ECC conversion data block 213.

The switching circuit 211 may be selectively connected to one of the first ECC conversion data block 212 and the second ECC conversion data block 213 based on the ECC select signal ECC Sel.

When the ECC select signal ECC Sel is a signal for outputting the first ECC conversion data, the switching circuit 211 may be connected to the first ECC conversion data block 212. Conversely, when the ECC select signal ECC Sel is a signal for outputting the second ECC conversion data, the switching circuit 211 may be connected to the second ECC conversion data block 213.

The first ECC conversion data block 212 may store the first ECC conversion data. In this case, when the first ECC conversion data block 212 is connected to the switching circuit 211, the first ECC conversion data may be output to the ECC conversion circuit 220. For example, when the first ECC conversion data block 212 is connected to the switching circuit 211 according to the ECC select signal ECC Sel, the first ECC conversion data may be output to the ECC conversion circuit 220.

The second ECC conversion data block 213 may store the second ECC conversion data. In this case, when the second ECC conversion data block 213 is connected to the switching circuit 211, the second ECC conversion data may be output to the ECC conversion circuit 220. For example, when the second ECC conversion data block 213 is connected to the switching circuit 211 according to the ECC select signal ECC Sel, the second ECC conversion data may be output to the ECC conversion circuit 220.

The ECC conversion circuit 220 may convert the data burst DB based on the ECC conversion data received from the ECC select circuit 210. In an embodiment, the ECC conversion circuit 220 may generate the first ECC data by encoding the data burst DB based on the first ECC conversion data, or may generate the second ECC data by encoding the data burst DB based on the second ECC conversion data. In addition, the ECC conversion circuit 220 may decode data burst DB and the first ECC data from the memory device 20 based on the first ECC conversion data or decode the data burst DB and the second ECC data based on the second ECC conversion data.

The first ECC data may be data including one or more parity bits generated as the data burst DB is encoded based on the first ECC conversion data. In this case, the first ECC data may include one or more parity bits that enable correction of errors occurring in any one of all bits included in the data burst DB.

The second ECC data may be data including one or more parity bits generated when the data burst DB is encoded based on the second ECC conversion data. Here, the second ECC data may include one or more parity bits that enable correction of errors occurring in a preset protected bit among bits included in each of pieces of the partial data included in the data burst DB.

The ECC conversion circuit 220 may include an encoder 221 and a decoder 222.

The encoder 221 may encode the data burst DB received from the host 2 based on the ECC conversion data received from the ECC select circuit 210. In an embodiment, the encoder 221 may generate the first ECC data by encoding the data burst DB based on the first ECC conversion data, or may generate the second ECC data by encoding the data burst DB based on the second ECC conversion data. The encoder 221 may output the data burst DB and ECC data to the memory device 20.

The decoder 222 may decode data burst DB and ECC data received from the memory device 20 based on the ECC conversion data received from the ECC select circuit 210. In an embodiment, the decoder 222 may decode the data burst DB and the first ECC data based on the first ECC conversion data or decode the data burst DB and the second ECC data based on the second ECC conversion data.

In an embodiment, the decoder 222 may not be able to determine whether the ECC data is the first ECC data or the second ECC data from the memory device 20. Here, the memory controller 10 selects one of the first ECC conversion data and the second ECC conversion data on the basis of the ECC select signal ECC Sel received together with the read request from the host 2 and transmits the selected one to the decoder 222. Accordingly, the data burst DB and the ECC data may be decoded by using the ECC conversion data used for encoding between the first ECC conversion data and the second ECC conversion data.

In an embodiment, the ECC conversion circuit 220 may change the circuit connection by the first ECC conversion data or the second ECC conversion data. For example, the ECC conversion circuit 220 may have a circuit connection changed to perform an operation based on the parity check matrix included in the first ECC conversion data or the second ECC conversion data.

In an embodiment, the ECC conversion circuit 220 may include variable ECC configurations, such as Repetition code, Hamming code, BCH code, and the like. For example, the ECC conversion circuit 220 may perform the encoding operation or the decoding operation by using Repetition code, Hamming code, or BCH code based on the first ECC conversion data or the second ECC conversion data.

In an embodiment, the ECC conversion circuit 220 may change H-matrix, such as Linear-Feedback Shift Register (LFSR) parameter. For example, the LF SR parameter may include three parameters that characterize the sequence of bits it produces, such as the number of bits N, the initial seed (the sequence of bits that initializes the register), and the tap position tap. For example, the ECC conversion circuit 220 may perform the encoding operation or the decoding operation based on the LF SR parameter.

When using the ECC circuit 200 included in the memory controller 10 as described above, the reliability of the data stored in the memory device 20 may be improved by encoding the data burst DB to correct errors for the preset protected bits among bits included in the data burst DB based on the ECC Sel. In addition, it is possible to increase the operating speed of the memory system 1 while improving the recovery performance for the protected bit.

Figure 4:
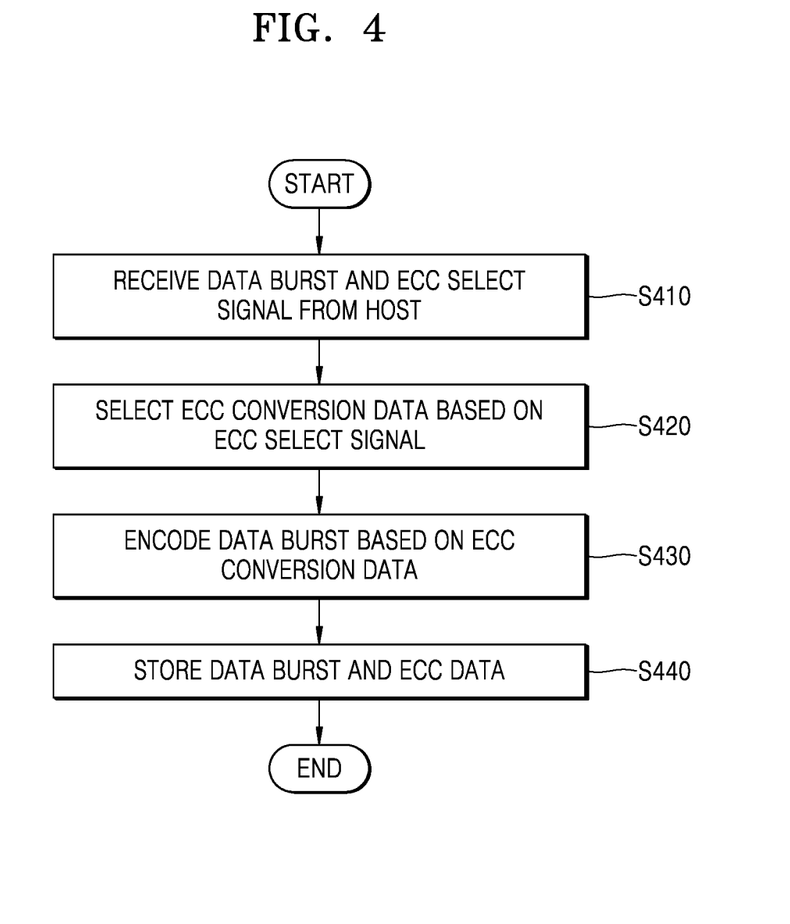
FIG. 4 is a flowchart illustrating a method of encoding a data burst of a memory controller according to an embodiment.

FIG. 4 is a flowchart illustrating a method of encoding a data burst of a memory controller according to an embodiment.

Referring to FIG. 4, in operation S410, the memory controller 10 may receive a data burst DB and an ECC select signal ECC Sel from the host 2.

The data burst DB and the ECC select signal ECC Sel may be input to the ECC circuit 200 of the memory controller 10. In this case, the ECC select signal ECC Sel may be input to the ECC select circuit 210 of the ECC circuit 200, and the data burst DB may be input to the ECC conversion circuit 220 of the ECC circuit 200.

In operation S420, the memory controller 10 may select ECC conversion data based on the ECC select signal ECC Sel.

The memory controller 10 may select and output one of the first ECC conversion data and the second ECC conversion data based on the ECC select signal ECC Sel through the ECC select circuit 210 of the ECC circuit 200.

In this case, the ECC select signal ECC Sel may be a signal set by the host 2 based on whether the data burst DB is data used for machine learning, and based on the type and characteristics of machine learning, the accuracy required for the data burst DB, and the conversion time limit of the data burst DB.

Figure 5:
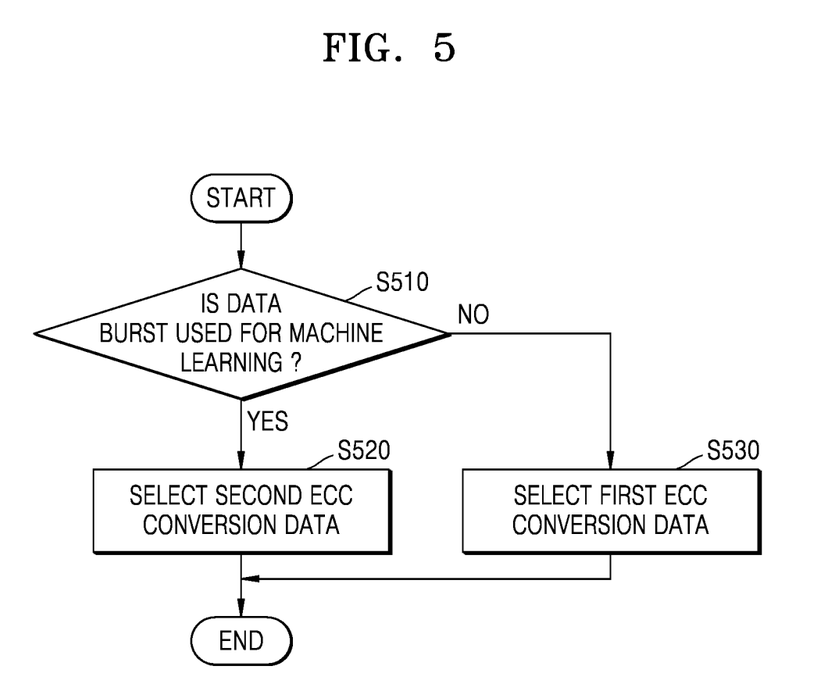
FIG. 5 is a flowchart illustrating a method by which a memory controller according to an embodiment selects ECC information.

An example in which the ECC select circuit 210 selects ECC conversion data based on the ECC select signal ECC Sel may be confirmed with reference to FIG. 5.

FIG. 5 is a flowchart illustrating a method of selecting ECC information by a memory controller according to an embodiment.

Referring to FIG. 5, in operation S510, the ECC select circuit 210 may determine whether the data burst DB is data used for machine learning.

The ECC select circuit 210 may determine whether the ECC select signal ECC Sel is a signal indicating that the data burst DB is data used for machine learning, and may determine whether the data burst DB is data used for machine learning.

When the data burst DB is data used for machine learning, the ECC select circuit 210 may select the second ECC conversion data by moving to operation S520.

Conversely, when the data burst DB is not data used for machine learning, the ECC select circuit 210 may select the first ECC conversion data by moving to operation S530.

Returning back to FIG. 4, in operation S430, the memory controller 10 may encode the data burst DB based on the ECC conversion data.

The memory controller 10 may encode the data burst DB based on ECC conversion data received from the ECC select circuit 210 through the ECC conversion circuit 220 of the ECC circuit 200.

Upon receiving the first ECC conversion data from the ECC select circuit 210, the ECC conversion circuit 220 may generate the first ECC data by encoding the data burst DB based on the first ECC conversion data. Upon receiving the second ECC conversion data from the ECC select circuit 210, the ECC conversion circuit 220 may generate the second ECC data by encoding the data burst DB based on the second ECC conversion data.

In operation S440, the memory controller 10 may store the data burst DB and ECC data (e.g., the first ECC data or the second ECC data) in the memory device 20.

The memory controller 10 may store, in the memory device 20 together with the data burst DB, ECC data generated by encoding the data burst DB through the ECC conversion circuit 220.

Figure 6:
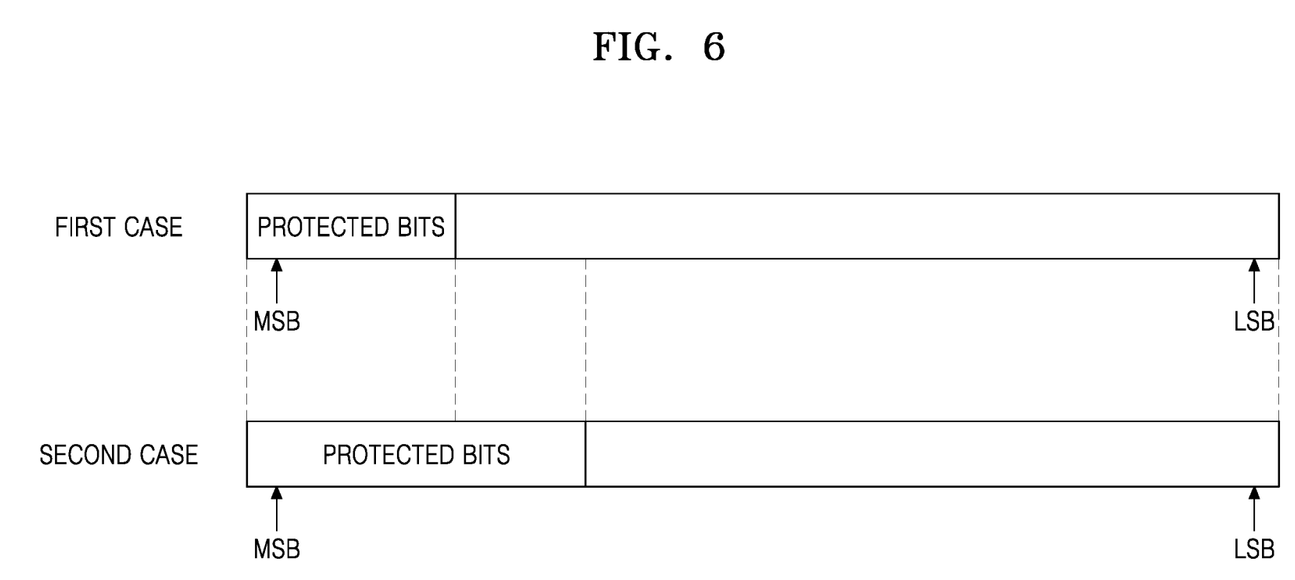
FIG. 6 is a flowchart illustrating a protected bit included in partial data of a data burst encoded in a memory controller according to an embodiment.

FIG. 6 is a flowchart illustrating a protected bit included in partial data of a data burst encoded in a memory controller according to an embodiment.

Referring to FIG. 6, protected bits set with respect to partial data of the data burst DB in the first case and the second case may be identified. In the first case and the second case, the protected bits may include continuous bits including the most significant bit of partial data. For example, in the first case, the partial data may include 32 bits and the protected bit may include one or two bits. In the second case, the partial data may include 32 bits and the protected bit may include four or eight bits.

In the embodiment of FIG. 6, compared with the second case, the first case may have a relatively low accuracy required for the data burst DB and a relatively short limit of the conversion time of the data burst DB.

The number of bits set as the protected bit in the first case may be smaller than the number of bits set as the protected bit in the second case. In this case, the ECC select circuit 210 may set the second ECC conversion data to include partial conversion information capable of error correction for a small number of protected bits among a plurality of pieces of partial conversion information in the first case. In addition, the ECC select circuit 210 may set the second ECC conversion data to include partial conversion information capable of error correction for a large number of protected bits among a plurality of pieces of partial conversion information in the second case.

Figure 7:
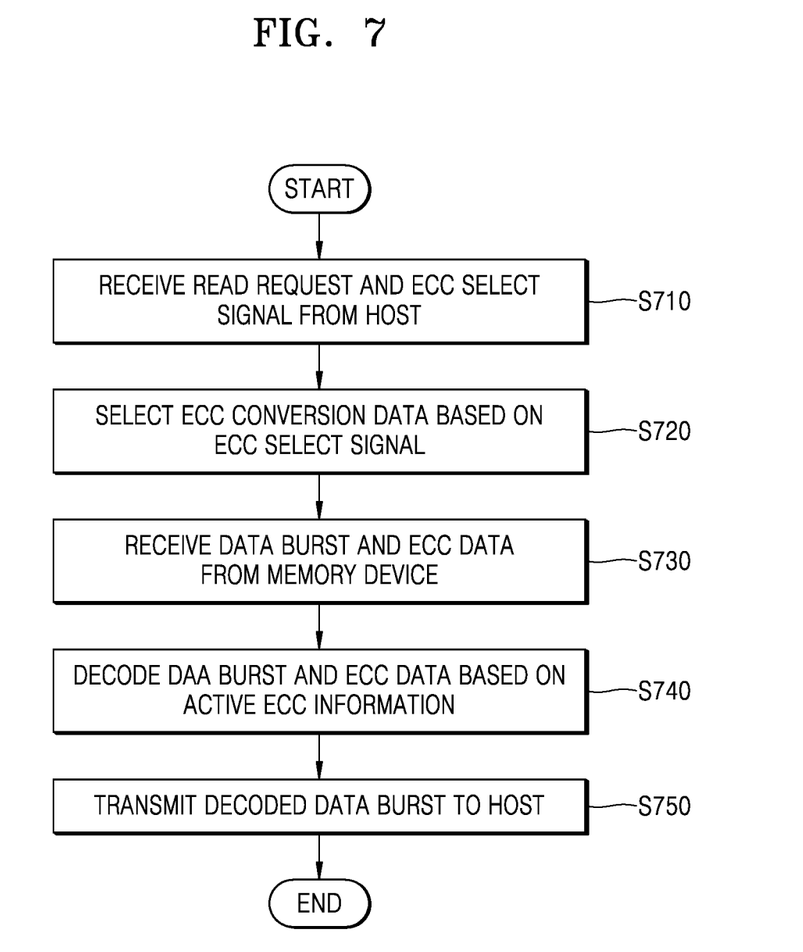
FIG. 7 is a flowchart illustrating a method of decoding a data burst of a memory controller according to an embodiment.

FIG. 7 is a flowchart illustrating a method of decoding a data burst of a memory controller according to an embodiment.

Referring to FIG. 7, in operation S710, the memory controller 10 may receive a read request and an ECC select signal ECC Sel from the host 2.

The read request and the ECC select signal ECC Sel may be input to the ECC circuit 200 of the memory controller 10. In this case, the data burst DB may be input to the ECC select circuit 210 of the ECC circuit 200.

In operation S720, the memory controller 10 may select ECC conversion data based on the ECC select signal ECC Sel.

The memory controller 10 may select and output one of the first ECC conversion data and the second ECC conversion data based on the ECC select signal ECC Sel through the ECC select circuit 210 of the ECC circuit 200.

In this case, the ECC select signal ECC Sel may be a signal set by the host 2 based on whether the data burst DB to be read from the memory device 20 is data used for machine learning, and based on the type and characteristics of machine learning, the accuracy required for the data burst DB, and the conversion time limit of the data burst DB.

A method of selecting ECC conversion data by the ECC select circuit 210 based on the ECC select signal ECC Sel may be as described above with reference to FIGS. 3 to 5.

In operation S730, the memory controller 10 may receive the data burst DB and ECC data from the memory device 20.

The memory controller 10 may read ECC data corresponding to the data burst DB together with the data burst DB from the memory device 20 based on the read request. The data burst DB and ECC data received from the memory device 20 by the memory controller 10 may be input to the ECC conversion circuit 220 of the ECC circuit 200.

In operation S740, the memory controller 10 may decode the data burst DB and ECC data based on the ECC conversion data.

The memory controller 10 may decode the data burst DB received from the memory device 20 and the ECC data corresponding to the data burst DB based on the ECC conversion data received from the ECC select circuit 210 through the ECC conversion circuit 220 of the ECC circuit 200.

Upon receiving the first ECC conversion data from the ECC select circuit 210, the ECC conversion circuit 220 may decode the data burst DB and the ECC data corresponding to the data burst DB based on the first ECC conversion data. Upon receiving the second ECC conversion data from the ECC select circuit 210, the ECC conversion circuit 220 may decode the data burst DB and the ECC data corresponding to the data burst DB based on the second ECC conversion data.

As the ECC conversion circuit 220 decodes the data burst DB and the ECC data corresponding to the data burst DB, an error occurring in the protected bits included in the data burst DB may be corrected.

In operation S750, the memory controller 10 may transmit the decoded data burst DB to the host 2.

The memory controller 10 may transmit the error-corrected data burst DB to the host 2 through the decoding process described above.

Figure 8:
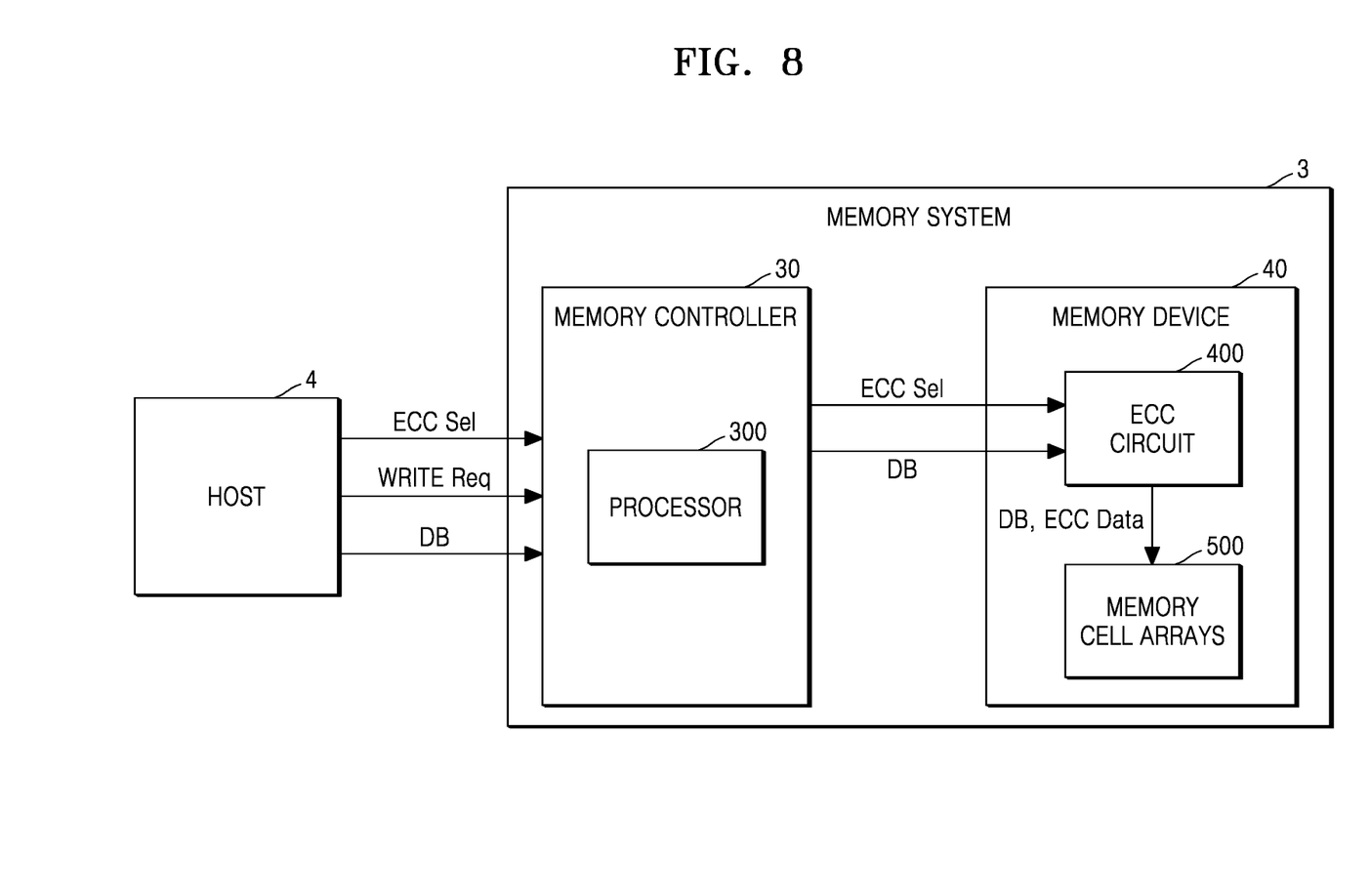
FIG. 8 is a block diagram illustrating a memory system based on a write operation, according to an embodiment.

FIG. 8 is a block diagram illustrating a memory system based on a write operation according to an embodiment.

Referring to FIG. 8, a memory system 3 according to an embodiment may include a memory controller 30 and a memory device 40.

In an embodiment, the memory controller 30 may include a processor 300, and the memory device 40 may include an ECC circuit 400 and a plurality of memory cell arrays 500. For example, in the memory system 3 according to an embodiment, the ECC circuit 400 may be included in the memory device 40 rather than the memory controller 30.

The memory controller 30 may receive an ECC select signal ECC Sel, a write request Write Req, and a data burst DB from the host 2. The memory controller 30 may transmit the received ECC select signal ECC Sel and the data burst DB to the memory device 40.

An operation of the processor 300 included in the memory controller 30 may be the same as an operation of the processor 100 included in the memory controller 10 of FIG. 1.

The ECC circuit 400 of the memory device 40 may receive the ECC select signal ECC Sel and the data burst DB from the memory controller 30. The ECC circuit 400 may select one of the first ECC conversion data and the second ECC conversion data based on the ECC select signal ECC Sel, and may generate the first ECC data or the second ECC data by encoding the data burst DB based on the one selected from the first ECC conversion data and the second ECC conversion data. In addition, the ECC circuit 400 may transmit the data burst DB and the ECC data to the plurality of memory cell arrays 500.

Operations of the ECC circuit 400, such as a method of selecting ECC conversion data by the ECC circuit 400, and a specific method of generating ECC data by encoding a data burst DB, by the ECC circuit 400, and configuration of the ECC circuit 400 may be similar to those of the ECC circuit 200 described above through FIGS. 1 to 7.

The plurality of memory cell arrays 500 may store the first ECC data or the second ECC data generated by the ECC circuit 400 together with the data burst DB.

Figure 9:
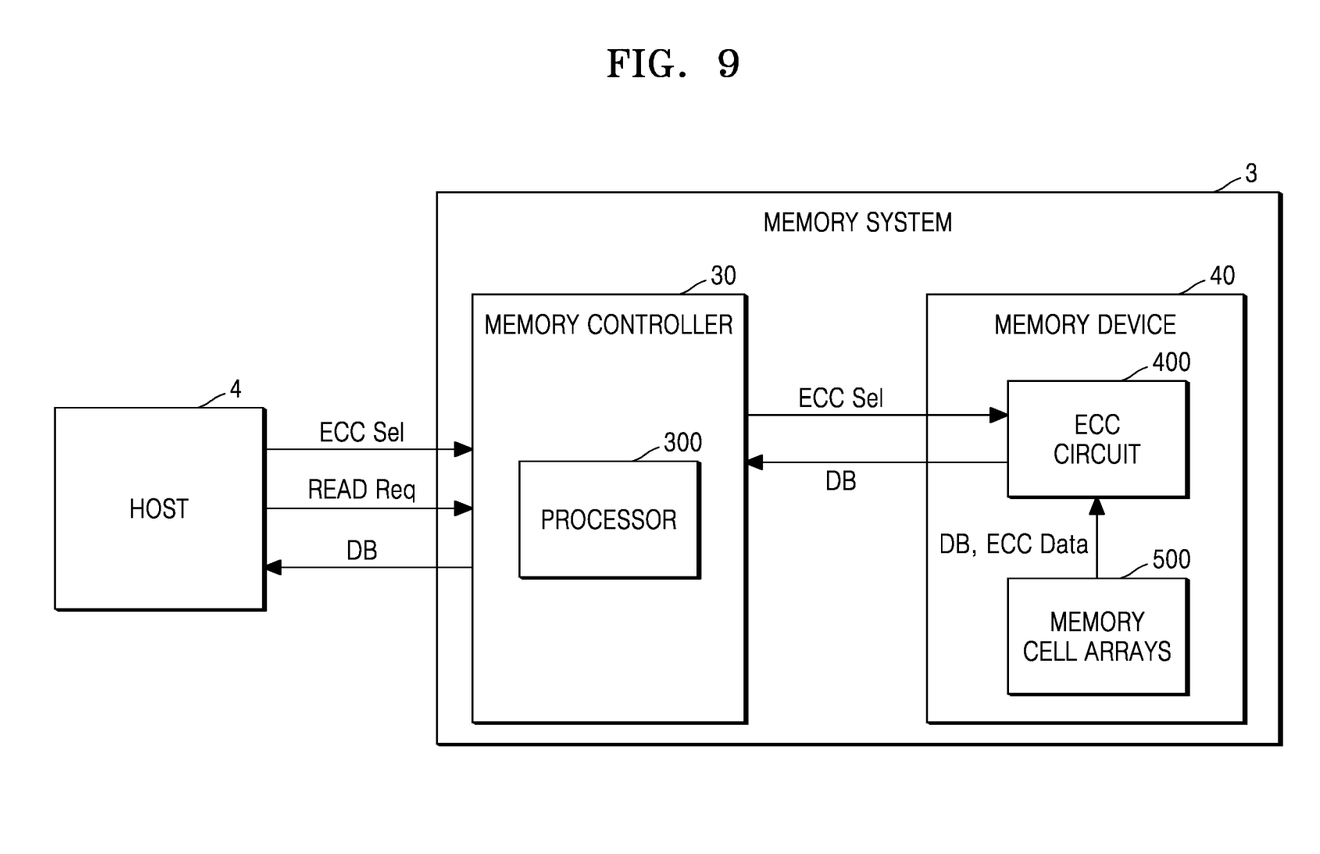
FIG. 9 is a block diagram illustrating a memory system based on a read operation, according to an embodiment.

FIG. 9 is a block diagram illustrating a memory system based on a read operation according to an embodiment.

Referring to FIG. 9, in the memory system 3 of FIG. 8, a block diagram in which only signal flows are displayed differently may be identified.

The memory controller 30 may receive an ECC select signal ECC Sel and a read request Read Req from the host 2. The memory controller 30 may transmit the received ECC select signal ECC Sel to the memory device 40.

The memory device 40 may read the data burst DB and ECC data from a plurality of memory cell arrays 500. The data burst DB and ECC data read from the plurality of memory cell arrays 500 may be decoded by the ECC circuit 400 based on the ECC select signal ECC Sel. As the ECC circuit 400 decodes the data burst DB and the ECC data corresponding to the data burst DB, an error occurring in the protected bits included in the data burst DB may be corrected.

The memory device 40 may transmit the decoded data burst DB to the memory controller 30. The memory controller 30 may transmit the received data burst DB to the host 4 in response to the read request Read Req.

Figure 10:
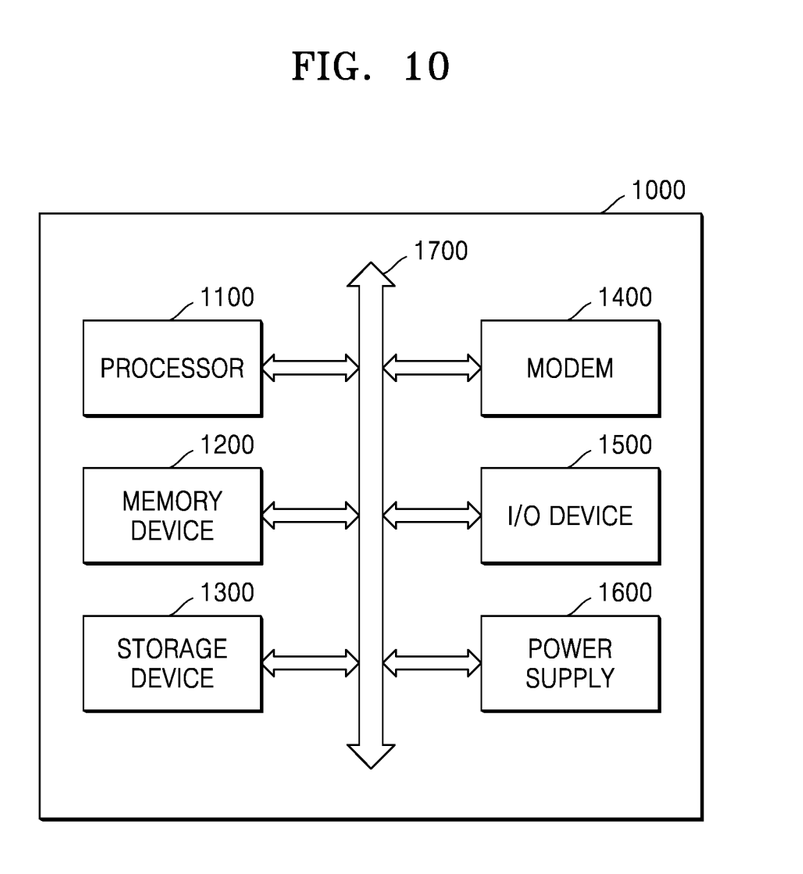
FIG. 10 is a block diagram illustrating an electronic device according to an embodiment.

FIG. 10 is a block diagram illustrating an electronic device according to an embodiment.

Referring to FIG. 10, an electronic device 1000 may include a processor 1100, a memory device 1200, a storage device 1300, a modem 1400, an input/output device 1500, a power supply 1600, and a bus 1700. The processor 1100, the memory device 1200, the storage device 1300, the modem 1400, the input/output device 1500, and the power supply 1600 of the electronic device 1000 may be connected to each other through the bus 1700. In this case, the storage device 1300 may be implemented to include any one of the memory systems 1 and 3 as described above with reference to FIGS. 1 to 9.

According to memory controllers 10 and 30 according to the embodiments, the reliability of data stored in the memory device may be improved by encoding a data burst to enable error correction for a preset protected bit among bits included in the data burst DB based on the ECC select signal ECC Sel. In addition, it is possible to increase the operating speed of the memory system while improving the recovery performance for the protected bit.

While the inventive concept has been particularly shown and described with reference to embodiments thereof, it will be understood that various changes in form and details may be made therein without departing from the spirit and scope of the following claims.

What is claimed is:

1. A memory controller comprising:
an error correction code (ECC) circuit configured to receive a data burst and generate first ECC data or second ECC data; and
a processor configured to control operations of the ECC circuit,
wherein the ECC circuit comprises:
an ECC select circuit configured to select and output one of first ECC conversion data and second ECC conversion data, based on an ECC select signal received from an outside of the memory controller; and
an ECC conversion circuit configured to:
generate the first ECC data by encoding the data burst based on the first ECC conversion data, or
generate the second ECC data by encoding the data burst based on the second ECC conversion data, and
wherein the second ECC conversion data is set to be capable of correcting an error generated in one or more preset protected bits among bits included in each of pieces of partial data included in the data burst.

2. The memory controller of claim 1, wherein the ECC select circuit is configured to:
when the ECC select signal is a signal indicating that the data burst is data not used for machine learning, select and output the first ECC conversion data, and
when the ECC select signal is a signal indicating that the data burst is data used for the machine learning, select and output the second ECC conversion data.

3. The memory controller of claim 2, wherein the second ECC conversion data is set to include one of a plurality of pieces of partial conversion information, based on a type and characteristics of the machine learning.

4. The memory controller of claim 2, wherein the second ECC conversion data is set to include one of a plurality of pieces of partial conversion information, based on an accuracy required for the data burst and a limit in a conversion time of the data burst.

5. The memory controller of claim 4, wherein the second ECC conversion data is set to include one of the plurality of pieces of partial conversion information such that the number of the one or more protected bits is proportional to the accuracy required for the data burst.

6. The memory controller of claim 4, wherein the second ECC conversion data is set to include one of the plurality of pieces of partial conversion information such that the number of the one or more protected bits is proportional to the limit of the conversion time of the data burst.

7. The memory controller of claim 4, wherein each of the plurality of pieces of partial conversion information is set to correct errors generated in different numbers of the one or more protected bits.

8. The memory controller of claim 1, wherein the one or more protected bits include a most significant bit (MSB) of the partial data.

9. The memory controller of claim 1, wherein the first ECC conversion data is set to correct an error occurring in any one of all bits included in the data burst.

10. The memory controller of claim 1, wherein the ECC select circuit comprises:
a first ECC conversion data block configured to store the first ECC conversion data;
a second ECC conversion data block configured to store the second ECC conversion data; and
a switching circuit selectively connected to one of the first ECC conversion data block and the second ECC conversion data block, based on the ECC select signal.

11. The memory controller of claim 10, wherein:
when the first ECC conversion data block is connected to the switching circuit, the first ECC conversion data is output to the ECC conversion circuit, and
when the second ECC conversion data block is connected to the switching circuit, the second ECC conversion data is output to the ECC conversion circuit.

12. The memory controller of claim 1, wherein the ECC conversion circuit is configured to change a circuit connection based on the first ECC conversion data or the second ECC conversion data.

13. A memory system comprising:
a memory device including a plurality of memory cell arrays and an error correction code (ECC) circuit; and
a memory controller configured to transmit a data burst and an ECC select signal to the memory device,
wherein the ECC circuit is configured to:
select one of first ECC conversion data and second ECC conversion data based on the ECC select signal, and
generate first ECC data or second ECC data by encoding the data burst based on the selected one of the first ECC conversion data and the second ECC conversion data, and
wherein the plurality of memory cell arrays are configured to store the data burst and the first ECC data or the second ECC data generated from the ECC circuit.

14. The memory system of claim 13, wherein the second ECC conversion data is set to be capable of correcting an error generated in one or more preset protected bits among bits included in each piece of partial data included in the data burst.

15. The memory system of claim 13, wherein the memory controller is configured to transmit the ECC select signal configured to enable the ECC circuit to be set to select one of the first ECC conversion data and the second ECC conversion data, based on:
whether the data burst is data used for machine learning,
a type and characteristics of machine learning,
an accuracy required for the data burst, and
a limit of a conversion time of the data burst.

16. The memory system of claim 13, wherein the ECC circuit comprises:
an ECC select circuit configured to select one of the first ECC conversion data and the second ECC conversion data based on the ECC select signal; and
an encoder configured to generate the first ECC data by encoding the data burst based on the first ECC conversion data, or generate the second ECC data by encoding the data burst based on the second ECC conversion data.

17. A memory system comprising:
a memory device including a plurality of memory cell arrays and an error correction code (ECC) circuit; and
a memory controller configured to transmit a read command and an ECC select signal to the memory device,
wherein the plurality of memory cell arrays are configured to store a data burst and ECC data associated with the data burst, and
wherein the ECC circuit is configured to, in response to the read command:
select one of first ECC conversion data and second ECC conversion data based on the ECC select signal, and decode the data burst and the ECC data output from the plurality of memory cell arrays based on the selected one of the first ECC conversion data and the second ECC conversion data.

18. The memory system of claim 17, wherein the second ECC conversion data is set to be capable of correcting an error generated in one or more preset protected bits among bits included in each piece of partial data included in the data burst.

19. The memory system of claim 17, wherein the memory controller is configured to transmit the ECC select signal configured to enable the ECC circuit to be set to select one of the first ECC conversion data and the second ECC conversion data, based on:
   whether the data burst is data used for machine learning,
   a type and characteristics of machine learning,
   an accuracy required for the data burst, and
   a limit of a conversion time of the data burst.

20. The memory system of claim 17, wherein the ECC circuit includes:
   an ECC select circuit configured to select one of the first ECC conversion data and the second ECC conversion data, based on the ECC select signal; and
   a decoder configured to decode the data burst output from the plurality of memory cell arrays and the ECC data, based on the selected one of the first ECC conversion data and the second ECC conversion data.

* * * * *